(12) United States Patent
Bergman Reuter et al.

(10) Patent No.: US 7,584,077 B2
(45) Date of Patent: Sep. 1, 2009

(54) PHYSICAL DESIGN CHARACTERIZATION SYSTEM

(75) Inventors: Betty L. Bergman Reuter, Essex Junction, VT (US); Mitchell R. DeHond, Essex Junction, VT (US); William C. Leipold, Enosburg Falls, VT (US); Daniel N. Maynard, Craftsbury Commons, VT (US); Brian D. Pfeifer, Red Hook, NY (US); David C. Reynolds, Essex Junction, VT (US); Reginald B. Wilcox, Jr., Cambridge, VT (US)

(73) Assignee: International Business Machines Corporation, Armonk, NY (US)

( * ) Notice: Subject to any disclaimer, the term of this patent is extended or adjusted under 35 U.S.C. 154(b) by 777 days.

(21) Appl. No.: 10/710,113

(22) Filed: Jun. 18, 2004

(65) Prior Publication Data
US 2004/0221250 A1 Nov. 4, 2004

Related U.S. Application Data

(62) Division of application No. 10/063,427, filed on Apr. 23, 2002, now Pat. No. 6,823,496.

(51) Int. Cl.
*G06F 17/50* (2006.01)
(52) U.S. Cl. .................. 703/1; 716/4; 716/19
(58) Field of Classification Search .......... 703/1; 716/4, 19; 700/103, 110, 120, 121
See application file for complete search history.

(56) References Cited

U.S. PATENT DOCUMENTS

| | | | |
|---|---|---|---|
| 3,751,647 A | 8/1973 | Maeder et al. | |
| 5,070,297 A * | 12/1991 | Kwon et al. | 324/754 |
| 5,084,824 A | 1/1992 | Lam et al. | |
| 5,438,527 A | 8/1995 | Feldbaumer et al. | |
| 5,539,652 A | 7/1996 | Tegethoff | |
| 5,754,826 A * | 5/1998 | Gamal et al. | 703/14 |
| 5,773,315 A | 6/1998 | Jarvis | |
| 5,953,518 A | 9/1999 | Sugasawara et al. | |

(Continued)

FOREIGN PATENT DOCUMENTS

JP 6216249 8/1994

(Continued)

OTHER PUBLICATIONS

Michael Retersdorf, "Yield Focused Defect Reduction Methodology," Mar. 1999, IEEE/SEMI Advanced Semiconductor Manufacturing Conference, pp. 309-313.

(Continued)

*Primary Examiner*—Paul L Rodriguez
*Assistant Examiner*—Dwin M Craig
(74) *Attorney, Agent, or Firm*—Ryan K. Simmons; Greenblum & Bernstein P.L.C.

(57) ABSTRACT

A system, method and media for locating and defining process sensitive sites isolated to specific geometries or shape configurations within chip design data. Once a systemic process sensitive site is identified, a 3D design checking deck is coded and executed through a design checker on physical design data. Target match shapes are produced and embedded back into the design data. Pictures, maps and coordinates of process sensitive sites are produced and sent to a website library for reference.

8 Claims, 8 Drawing Sheets

U.S. PATENT DOCUMENTS

| | | | |
|---|---|---|---|
| 6,044,208 A | | 3/2000 | Papadopoulou et al. |
| 6,070,004 A | | 5/2000 | Prein |
| 6,091,249 A | * | 7/2000 | Talbot et al. ............... 324/751 |
| 6,169,960 B1 | | 1/2001 | Ehrichs |
| 6,210,983 B1 | | 4/2001 | Atchison et al. |
| 6,246,245 B1 | * | 6/2001 | Akram et al. ............... 324/754 |
| 6,305,004 B1 | * | 10/2001 | Tellez et al. ............... 716/12 |
| 6,311,139 B1 | | 10/2001 | Kuroda et al. |
| 6,449,757 B1 | * | 9/2002 | Karniewicz ............... 716/7 |
| 6,642,744 B2 | * | 11/2003 | Or-Bach et al. ............... 326/39 |
| 6,823,496 B2 | | 11/2004 | Bergman et al. |
| 2002/0072162 A1 | * | 6/2002 | Dor et al. ............... 438/200 |

FOREIGN PATENT DOCUMENTS

JP      1024225      9/1998

OTHER PUBLICATIONS

K. W. Lallier and A.D. Savkar, "Relating Logic Design to Physical Geometry in LSI Chip," IBM Technical Disclosure Bulletin, vol. 19, No. 6, Nov. 1976, pp. 2140-2143.

C.H. Stapper, "High Yield Semiconductor Logic Wiring," vol. 30, No. 11, Apr. 1988, IBM Technical Disclosure Bulletin, pp. 366-367.

D. Guedj and M. Rivier, "Method to Computer the Random Photo Yield of Integrated Circuits," vol. 32, No. 7, Dec. 1989, IBM Technical Disclosure Bulletin, pp. 242-244.

\* cited by examiner

Extraction data Contents Table

Summary  
Map of Windows

Target Matches  
Reference for min spaced M4 over wide spaced M3  
  1. (X1,Y1) <specific info1>  
  2. (X2,Y2) <specific info2>  
  3. (X3,Y3) <specific info3>  
Reference for min spaced M5 over wide spaced M4  
  4. (X4,Y4) <specific info4>  
  5. (X5,Y5) <specific info5>

. . . (etc.)

Fig. 5

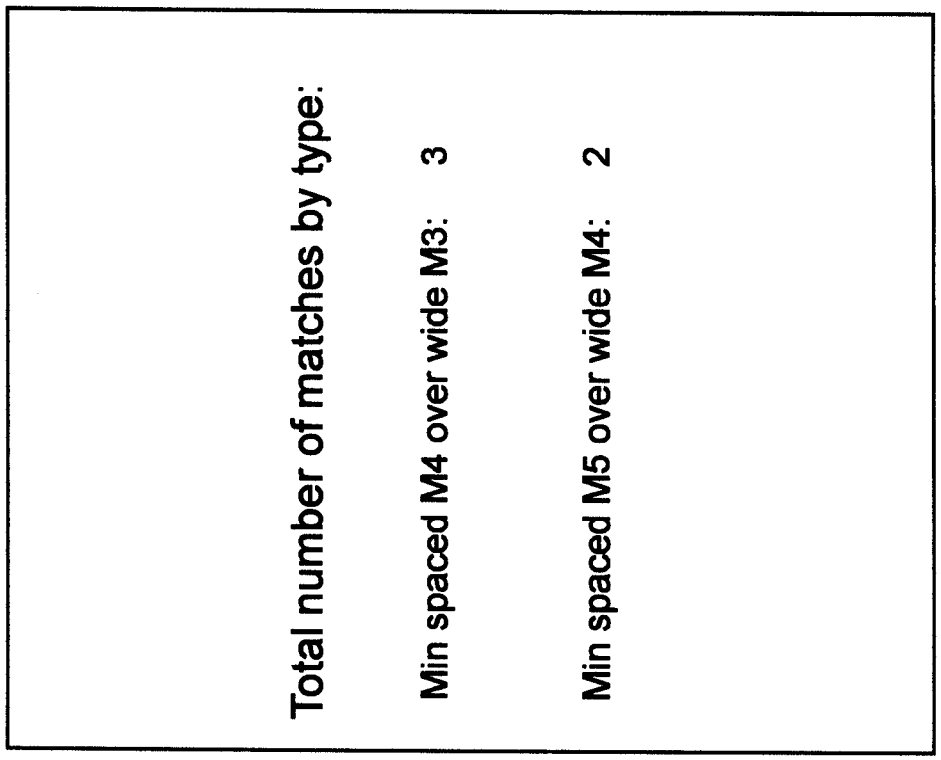
Fig. 7 - Tgt Match Summary
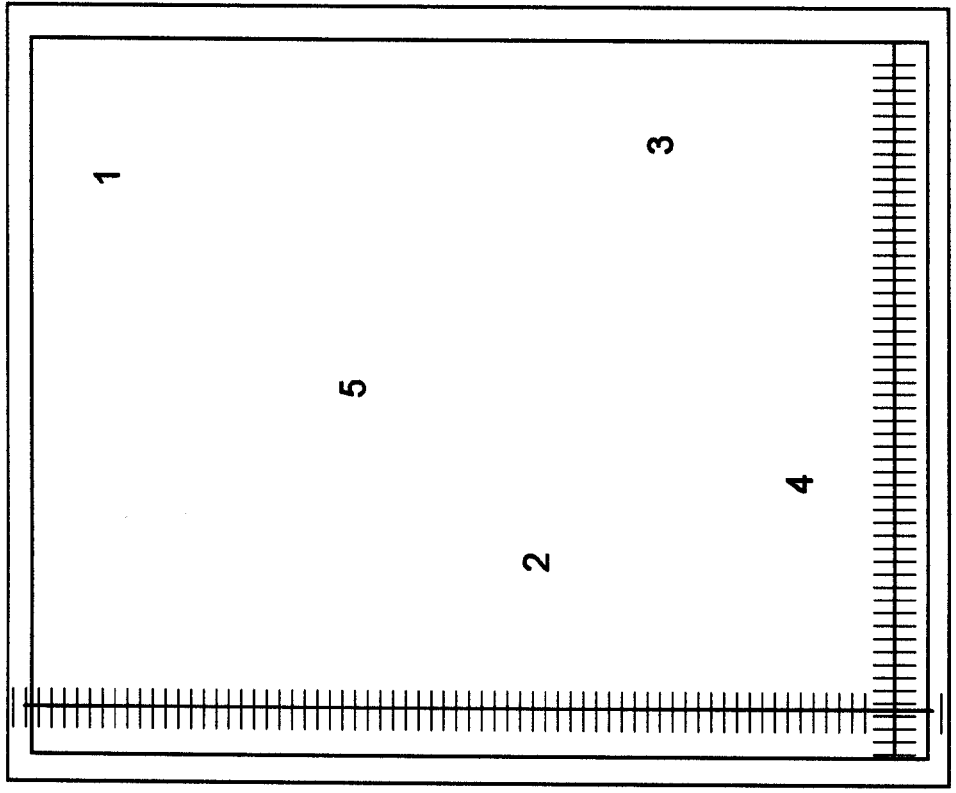
Fig. 6 - Chip Map Reference w/ scale & origin

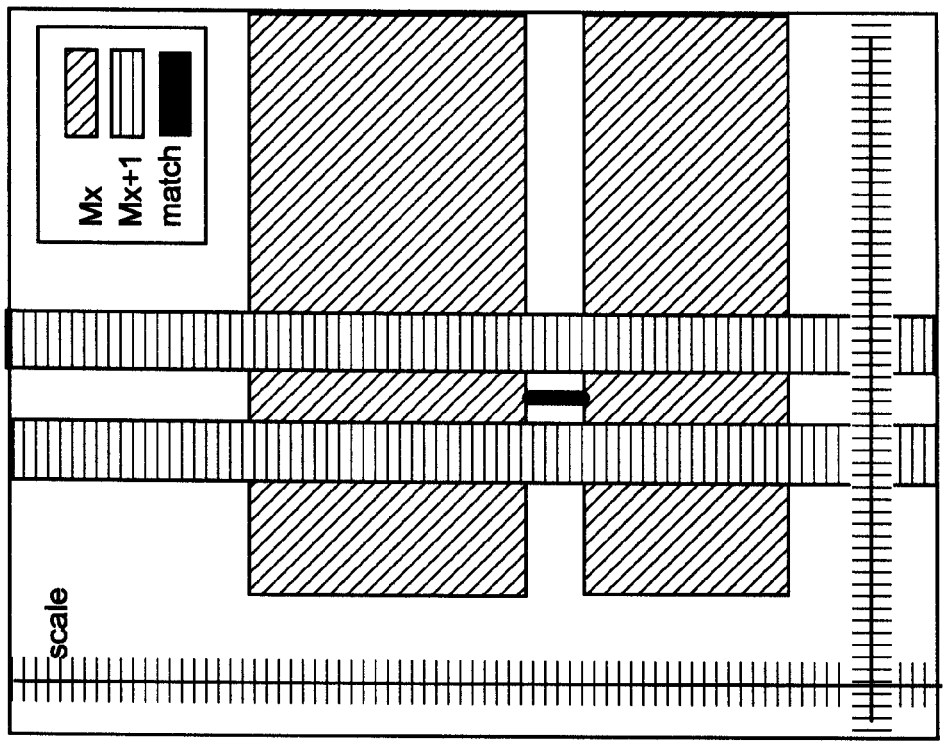
Fig. 9 - PSS Geometry
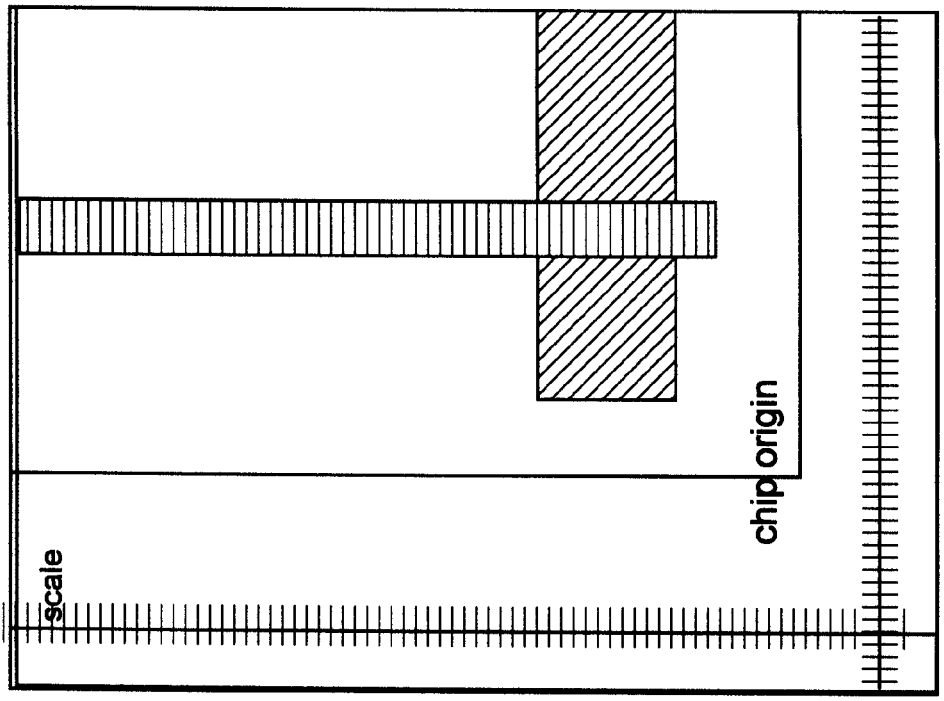
Fig. 8 - Chip Origin Reference

PHYSICAL DESIGN CHARACTERIZATION SYSTEM

BACKGROUND OF INVENTION

This application is a divisional application of U.S. Ser. No. 10/063,427, filed Apr. 23, 2002, the disclosures of which are incorporated by reference herein in their entirety.

This invention describes a system and method for locating and defining process sensitive sites isolated to specific geometries or shape configurations within the chip design data, also leveraging the knowledge of the process sensitive sites found. Process sensitive sites are defined as those areas where the design assumptions and expectations have exceeded the actual process capability.

Electrical shorts and opens parameters are impacted where the process tolerance is not design compatible. This systematic yield loss may be driven by RIE loading effects, lithographic offsets, over/under layout sensitivities, topography, pattern density, and other adjacency effects, at specific process sensitive sites. Given the compression of the yielding production ramp-up cycle, design revisions with work in progress turns are no longer an option.

Fabricators and designers commonly use tools or systems for placing shapes to improve layout sensitivity and optimize for random defect tolerance. For example, wiring layout tools will not only optimize routing for timing and reduced delay, but also to modulate defect tolerance. The defect tolerance may be analyzed by critical area versus defect size computation or optionally analyzed by the distance and run length between conductive wires susceptible to random particles. Fabricators also use tools and systems for design rule and shapes checking. Another standard methodology to compute random photo yield includes throwing random defects at-level, generating faults at the random defect sites, then selecting the faults with shape checking programs. Yield is a function of the number of faults and the size distribution.

Systematic process defects are modulated with the use of automated tools or systems to place dummy shapes or slots, place additional redundant vias or contacts or other redundant elements, and to perform layout modifications for lithographic proximity corrections, and for other RIE and lithographic effects. In the semiconductor industry, these design-for-manufacturing activities are paired with other product or design complexity analyses such as total length of routed wires, and single via count data, for example.

Computer aided design analysis tools are also utilized in industry and integrated with manufacturing and test simulators such that circuit designers can understand the impact of design issues on manufacturability of test processing.

However, the inventors are not aware any tools or systems looking for sensitivities related to structures or process and layout incompatibilities, and leveraging that information as feedforward to the designer, as well as leveraging that information in manufacturing process controls methodologies, as is described above.

SUMMARY OF INVENTION

Therefore, a goal of this physical design characterization system is to improve the technology product development and the probability of first time fabrication success for new products and partnumbers. Once a systematic process sensitive site is identified, 3D design checking decks are coded and executed on the physical design data. Checking deck jobs are triggered and processed for each new chip design when it is introduced into the fabricator. Specific geometries and configurations in areas of known or potential layout sensitivities are identified as chip coordinates to the process owner and design team. Pictures of part number specific process sensitive sites are captured along with dimensional layout description and sent to a web site library for easy reference and analysis.

This physical design challenges for new partnumbers, the reference tool may be used to provide solution insights, it may be used to update tactical projections and floor plans, and the reference retains technology learning which can be reapplied to next technologies. It can also be used to improve design for manufacturing compliance, and used for resource management or prioritization correlated to difficult design partnumbers or sectors.

All the above results in improved serviceability, avoidance of production stoppage and scrap, and measurable time-to-profit achievements.

BRIEF DESCRIPTION OF DRAWINGS

FIG. 5 illustrates a textual example of what appears in the contents table of this invention.

FIG. 6 illustrates in a graphical form an example of what appears on the chip map reference page of this invention.

FIG. 7 illustrates a textual example of what appears on the target summary page of this invention.

FIG. 8 illustrates in graphical form an example of what appears on the chip origin page of this invention.

FIG. 9 illustrates in a graphical form an example of the what appear on the process sensitive geometry page of this invention.

DETAILED DESCRIPTION

Figure 1:
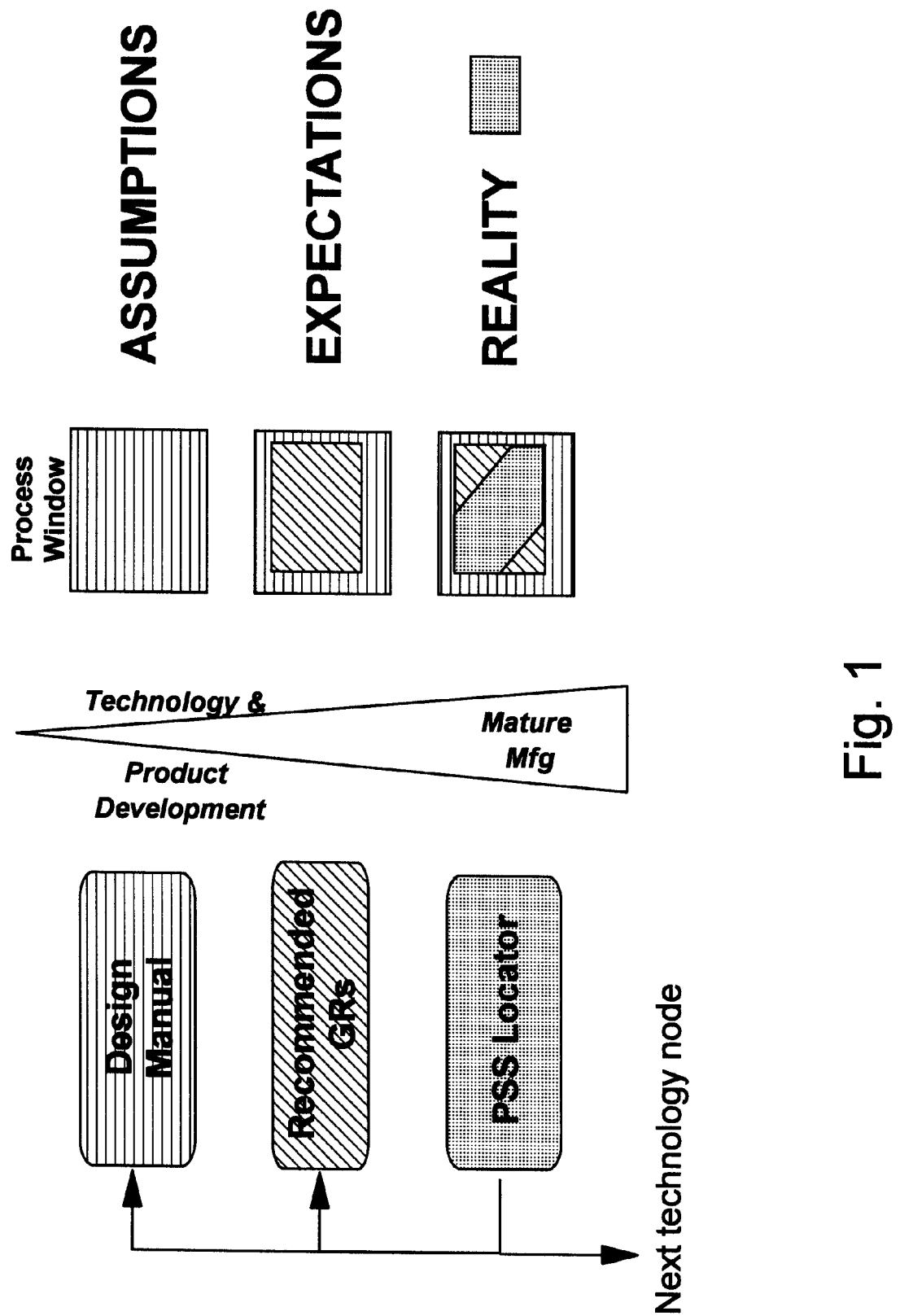
FIG. 1 illustrates in a graphical form the differences between technology defined process windows and actual production process windows.

As illustrated in FIG. 1, the genesis of each new technology node includes forming process and groundrule assumptions that will meet aggressive design configurations, competitive benchmarks, technology pitch, and feature portfolios. As illustrated, the process window changes as these original assumptions are turned into expectations and are further modified to the reality of the manufacturing floor. Further down the cycle toward manufacturability, technology engineers define the limits of the many process windows in chip fabrication, such as process tolerance, topography, reticle aberrations, tooling limitations, etc. Those limits are then converted into groundrule expectations and definitions through experience, technology qualification results, and/or anecdotal results. A process sensitive sites locator, as part of design content analysis system, allows the manufacturer to assess each design against the actual process capability, i.e., the reality in manufacturing, and to generate a unique control specification based on the design's content.

Figure 2:
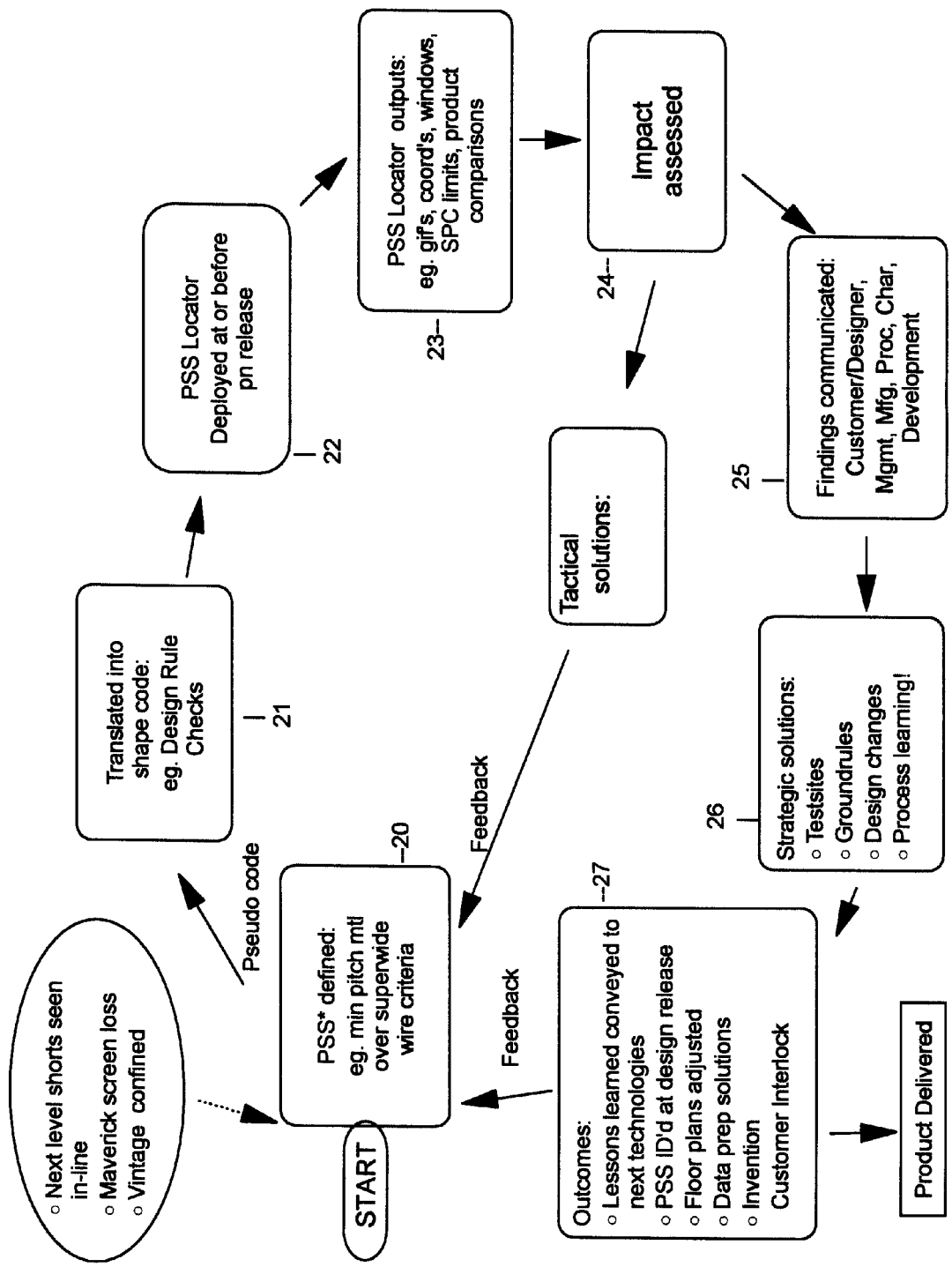
FIG. 2 illustrates in block diagram form how this characterization system and method works in a semiconductor development and manufacturing environment.

As shown in FIG. 2 a system also provides a feedback and strategic solution path to both technology development and design. This general methodology could be further extended to describe other physical design characterization (PDC) systems, in addition to the process sensitive sites locator described by this invention.

The primary goal of process sensitive sites locator is to locate design-process sensitive regions. One example of a process sensitive site is minimum pitch wires lying above wide metal wires, the latter separated by a narrow insulator (trench). Topographies induced within the integration may lead to electrical shorts at subsequent wiring levels. This is shown in block 20 of FIG. 2. In block 21 the invention translates the structural criteria into shape code. At block 22 the locator is deployed automatically when new part numbers are generated. At block 23 the locator runs and creates an output that can be used for characterization. At block 24 engineering assesses the impact of the results of block 23 and problems are identified. At block 25 the impact and problems are communicated to other engineering and development organizations. At block 26 the strategic solutions appropriated for the problems are chosen. At block 27 appropriate outcomes are provided to customers and fabricator personnel. Depending on the outcome a change in the criteria for the process sensitive sites locator is determined. As an alternative, the impact can be directly communicated to manufacturing through tactical solution (block 28) and then depending the solution the locator criteria are changed.

Figure 3:
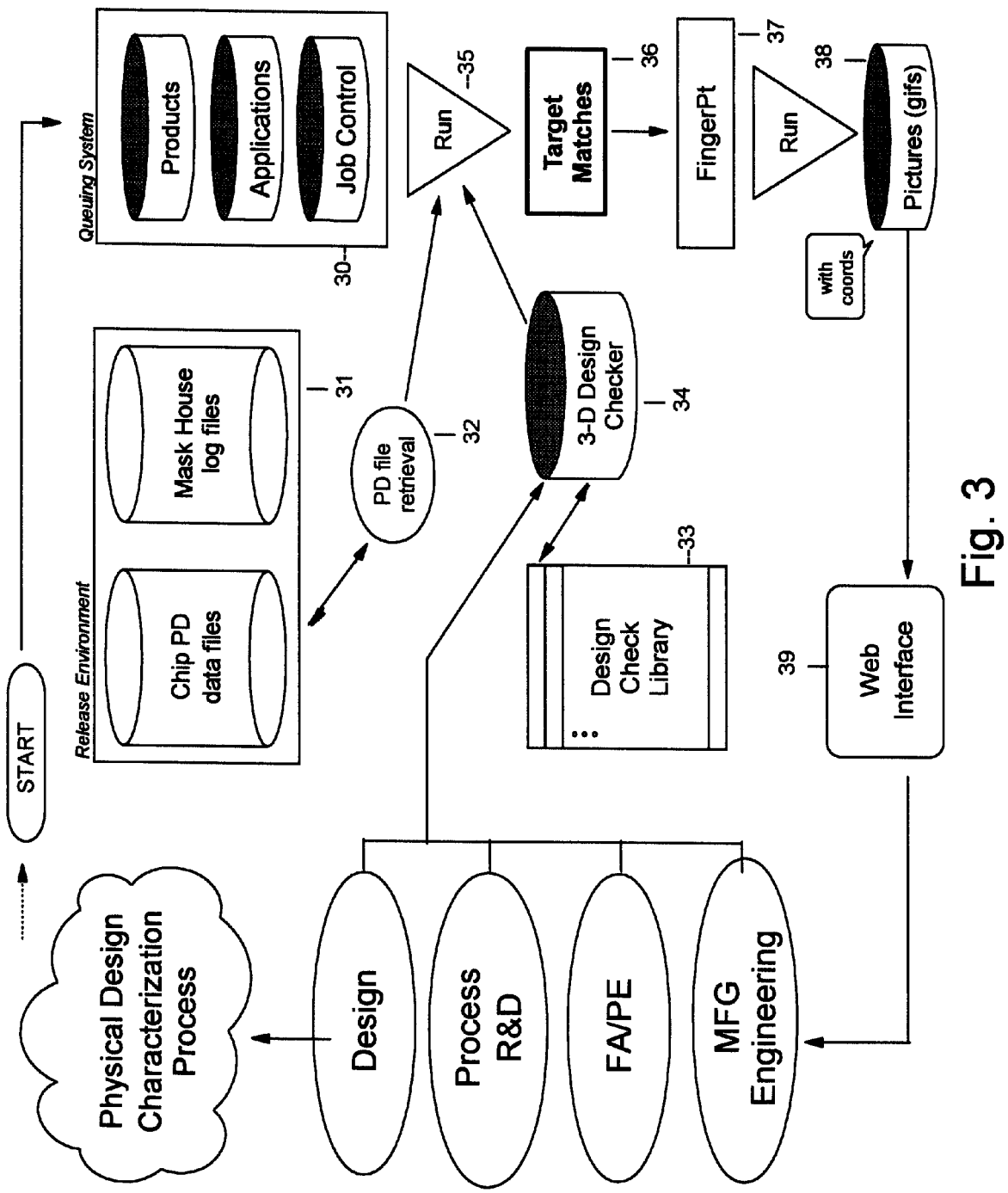
FIG. 3 illustrates in a graphical form the system architecture for the physical design characterization system of this invention.

The system architecture for this process sensitive sites locator is described in reference FIG. 3. This architecture provides for the methodogy described in blocks 21 through 23 of FIG. 2. The system provides a fabricator with the opportunity to find a menu of process sensitive sites in an automated manner before or when new partnumbers enter the fabricator, scan the portfolio of released partnumbers for a (recently) defined process sensitive sites, or analyze a specific partnumber in search for new process sensitive "swamp" site. To process the structures described in block 20 of FIG. 2, one needs to pull in the specific data into a queuing system. The queuing system of block 30, FIG. 3, allows for the interrogation of prerelease or release environment, which contains a record of chips, chip sizes, layers and design levels, partnumbers, and other pertinent information. Since these types of jobs are a good match for a distributed computing environment, a job scheduler (LoadLeveler, an IBM product, was used in the inventor's embodiment) is used to dispatch the job streams. Physical design data is transferred from the release environment of block 31, checked for validity and proper levels in block 32 and then prepped if necessary. The next step is to perform the desired 3D design check in block 35 in a computer runtime environment suitable for handling large data loads and design checking software. The 3D design checker is comprised of one or more checks from an optimized code library. The 3D design checker will be further described below. These checks correspond to specific physical design characteristics or regions that may cause productivity loss. This is shown in FIG. 3 as elements 33 and 34. The output of the design checker is the process sensitive sites target matches of block 36, collected as target match shapes or vectors inserted into the original data. This data is then processed by extraction of physical design data in a graphics processing system 37 ("FingerPt" shown in block 37 will be discussed below), which produces pictures and maps of the target matches in block 38. This visualization technique is organized into the web site of block 39 accessible by fabricator, development, and design personnel, along with site coordinates for auto loading into inspection tools or deployment for physical analysis.

The data and programs discussed above are stored in a variety of memory storage devices containing well-know media (disks, tapes, RAM, ROM, etc.) which are parts of the components of the system of FIG. 3 provided above.

Process sensitive sites target matching is dependent upon a clear definition, translated into design rule checks, of what the process sensitive sites are (FIG. 2, block 21). As an example of such definitions, the metal wiring levels may include the following structures:

1. Min Spaced Via Farms on Different Nets=X×N arrays of vias that are min space. Line ends, passing wires, or electrical nets may also be described. Light interference, tool tolerance, etc, may cause these vias to print large.

2. Min Pitch Metal over Wide Metal Regions=next level metal passing over a metal line of X×N minimum width may lead to electrical shorts from process induced topography. Other criteria could include isolating the search to regions where the local pattern density reaches a specified criterion, and searching for min width adjacent wiring.

3. From the earlier example: Min Pitch Metal over Insulator Trenches=similar to #2, but wires passing over insulator regions immediately adjacent to or between large metal lines. These areas may lead to shorts at the next wiring level.

These definitions are then applied to 3-D Design Checker 34 through the Design Check Library 33. Looking for minimum pitch metal over insulator "trenches" entails a specific 3D design check comprised of calls to a source library containing frequently used base functions. These base functions are coded using an industry available non interactive design checking tool such as "Hercules" from Avant!, "Caliber" from Mentor Graphics, or the "Niagara" EDA tool from IBM and described by the following pseudo-code:

First: Wide Underlying Metal/Insulator a) Take as input the lower metal level of interest. Also take as input a wide metal dimensional criteria, and wiring separation dimensional criteria.

b) Keep only the metal meeting the minimal wide metal dimensional criteria.

c) Generate corresponding insulator regions.

d) Keep only the insulator regions meeting the minimal insulator dimensional criteria.

e) Return the results of b) and d).

Then: Target Match/Region Determination a) Take as input a 3D check (i.e. space, width, or some other characteristic, along with dependencies, filters, etc), input, and criteria.

b) Determine a single target match collected as a vector or shape (region) for each set of shapes not meeting the checking requirement.

c) Attribute these shapes with check and level information to be passed to the physical design visualization program (described later).

Illustrating further, an example of a design check utilizing some of the above base functions, is described by the following pseudo-code: Metal shorts due to induced topography:

a) Take as input the metal layer experiencing shorts and the layer below. Also take the minimum space and width criteria for the upper metal, and the wide metal dimensional criteria described in base function "wide underlying metal/insulator".

b) Determine where the wide lower metal is by using the base function "wide underlying metal/insulator".

c) Determine which upper metal is at minimum pitch.

d) Identify the minimum pitch regions found in c) that intersect with the wide lower metal found in b).

e) Use d) and the base function "target match/region determination" to find the target matches.

f) Add these collected matches or shapes to the original design for later use during extraction of the PD data.

Figure 4:
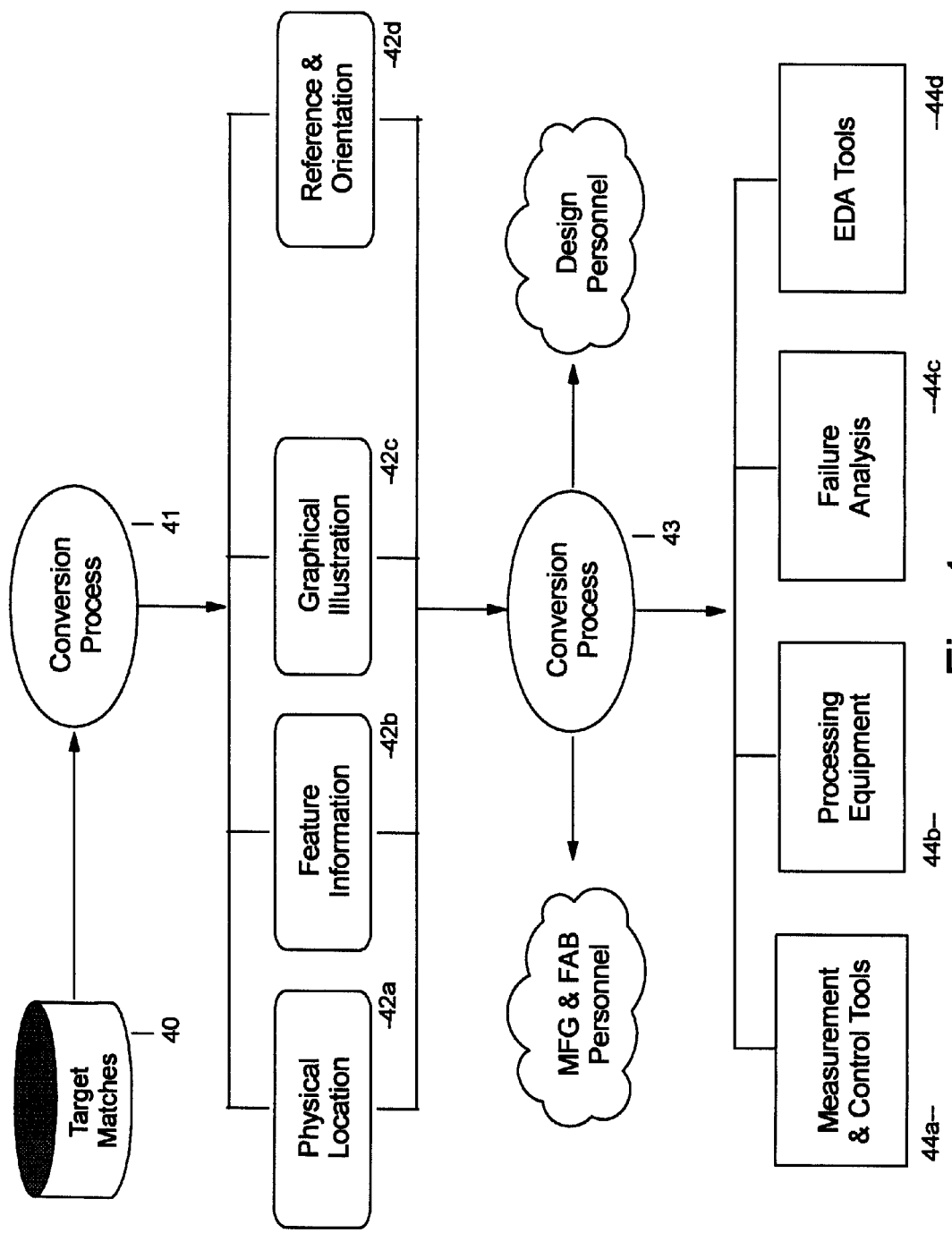
FIG. 4 illustrates in block diagram form the conversion process that provides data that is visible to personnel and useful to processing and analysis equipment.

The process sensitive sites locator organizes and presents the resulting data after identifying the target matches associated with a particular 3D design checker. The resulting data are in a format that the engineer can easily understand, make use of, and visualize through the use of physical design extraction data. The data are output to a Web site and contain a summary and details of the findings for each process sensitive sites. A high level illustration of how process sensitive sites locator information is communicated and used is shown in FIG. 4.

The organizational phase of the output, named FingerPt, consists of collecting and sorting the target matches by type (there may be multiple types of targets for a single design check run). This shown as block 40 on FIG. 4. Because there may be thousands of sensitive sites, the data are sampled in block 41 in order to reduce data volume while maintaining a representative group of matches, and extracting information about the individual matches (e.g., geometric and attribute data). The presentation phase consists of creating a series of "views" as shown in blocks 42a, b, c and d of the data shipped to a web site containing textual and graphical pages (in GIF format).

This information is then converted in block 43 to data recognizable by analysis and processing equipment shown as 44a, b, c and d.

The data is presented on a website. The website contains a contents table which consists of a selection of "hot links" to the other outputs from the data extracted through FingerPt. The information that is provided includes a chip map reference, a data summary, and a series of origin and geometry output pages. The series of graphical pages occur for each target match of the particular type of target.

"Min Pitch Metal over Insulator Trenches" is an example of one type of target. The Contents Table, for the example shown in FIG. 5, includes a unique integer to identify the target match kept in the sample, an X-Y coordinate pair for the match, and additional information specific to the process sensitive sites match (generated in the design check run).

The chip map page, an example of which is FIG. 6, consists of X-Y locations of the target matches in an overall view within the chip or circuit, and are indicated by unique integers corresponding to the graphical pages.

The summary page, an example which is FIG. 7, consists of a list of the target types, and the total number of matches of each type in the design check data file before data reduction.

There is a chip origin reference, an example of which is FIG. 8, provided for each target type in the output file. The chip origin reference provides a visual confirmation with regard to the geometry pages to compare with on-wafer origin, and in the preferred embodiment they consist of views of the extreme lower left section of the geometry, showing data levels relevant to the particular target type.

The individual geometry pages, an example of which is shown in FIG. 9, give a graphical representation, using GL1 in the preferred embodiment, of the shapes that are relevant to a particular target match. Irrelevant data levels are suppressed in order to improve clarity. X and Y axes include data scales, and a legend identifies data levels by color, line style, and fill style. One of these levels contains the target marker information, shown as the specific location of the target match, generated by the design data check for the particular target match.

The following pseudo-code describes how it works:

1. Take as input parameters: the PD data file, X-Y coordinate file, HTML/GIF output directory, target matches, window margin, view set (colors, fill patterns, etc.), and window limit.

2. Read the model data from the PD data file.

3. Create an internal list of target match windows:

3A. If writing windows by shape:

a) Hierarchically traverse all shapes on the match level, building a list of match types, determining pertinent data levels, and counting target match shapes by type.

b) Traverse the match shapes again, using the information previously gathered to build a list of windows by selecting the Nth shape of each match type, where "N" is determined by the window limit and the number of target match shapes of that type. This method of sampling helps avoid clustering of windows.

c) Sort the window list by match type.

3B. If writing windows by X-Y coordinates:

a) Traverse the coordinate file, building a window list by adding a window for each coordinate location.

4. Create a GIF file in the HTML directory containing a graphical map of the selected target match locations.

5. Create a summary HTML file, listing the total number of matches for each error type.

6. Create an HTML index file, to be filled in with a selectable line for each GIF file written.

7. Create a series of GIF files, one for each window in the list generated in step 3:

For each window in the list:

a) If it is the first tgt match of its type, create a GIF file of the extreme lower-left corner of the input model, showing the data levels pertinent to the given match type.

This is to aid the reviewer in determining the orientation of the data.

b) Create a GIF file of the data model within the window, showing the data levels pertinent to the match type, and including a legend defining the data levels.

c) Add a selectable line to the index file for the window, giving the match number, match type, and X-Y coordinates of the target match.

Figure 10:
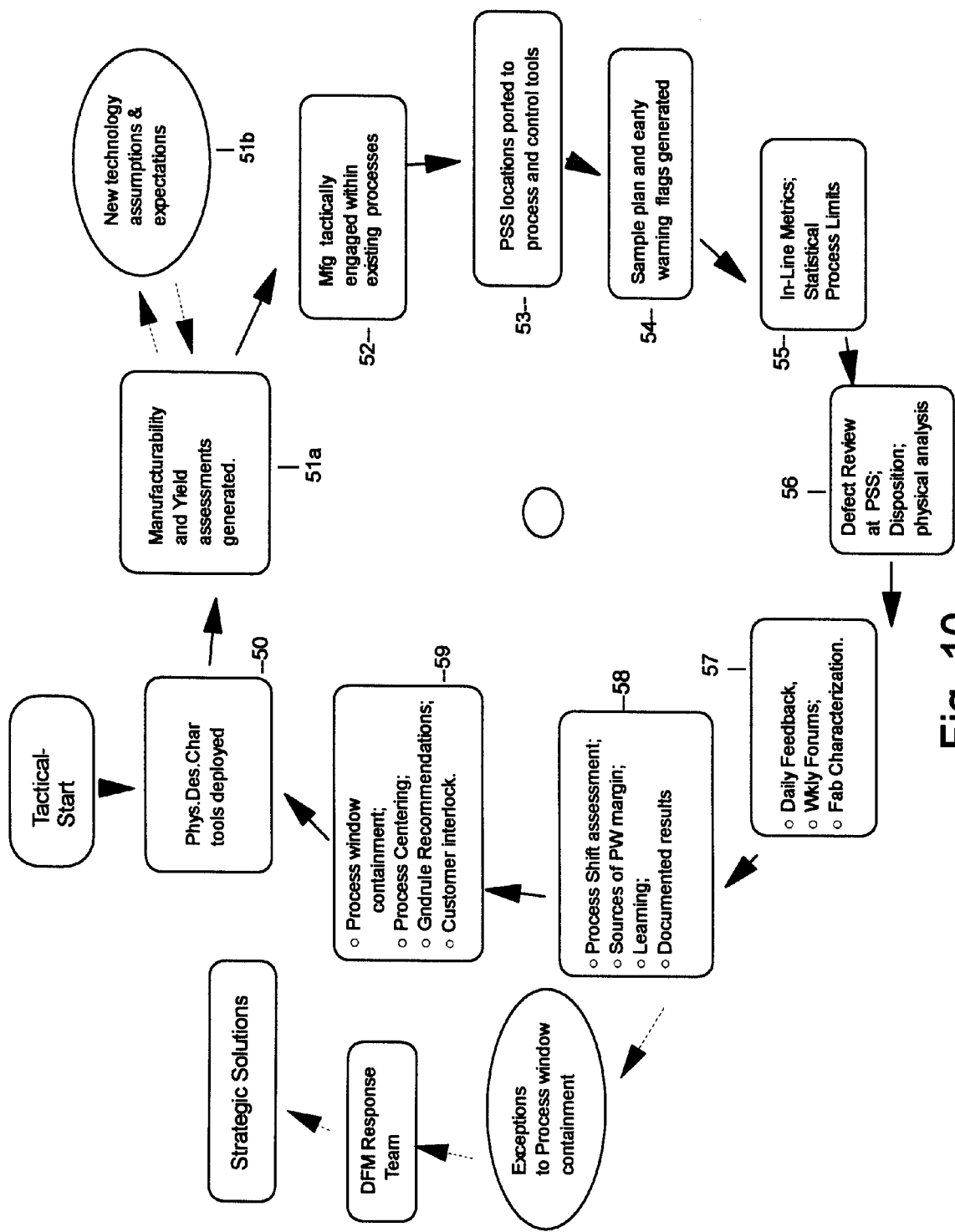
FIG. 10 describes in block diagram form the manufacturing tactical steps utilizing Fingerpt output.

FIG. 10 describes the manufacturing tactical steps utilizing the Fingerpt output described above. In the preferred embodiment, the process sensitive sites locator is triggered in an automatic execution of the 3D design rule check job, shown in block 50, and is driven by a traceable design release process. The locator provides knowledge of designs coming into the fabricator such that proactive measures can be taken for learning and controls methodologies. The process sensitive sites locator output, ported to a Web application database, is reviewed by the engineering team to determine ease vs risk of manufacture and manufacturing readiness, shown in 51a. The goal is to determine if all projected and known critical layouts have been exercised and shown to be contained within the process window tolerances allowed in the specifications. The assessment, used to accomplish this goal, includes but is not limited to a comparison of yield loss paretos to process sensitive site findings in type and count.

The assessment becomes crucial with the reduction of pitch and critical dimension driven by advanced technologies. Advanced technology assumptions and expectations are shown in block 51b, where the process tolerance can consume the full breadth of the process window leaving little to no margin for design sensitivities. Engineering requests for process sensitive site locator may also be defined and run for the purpose of analyzing development testsites.

The use of the process sensitive sites locator to determine systematic losses from layout sensitivities, shown in block 52, is implemented in concert with an existing process used for random defect learning and controls. The implementation decisions may include but are not limited to sample plan and personnel resource. The sample plan, in block 53, includes representation by technology, product volume, process integration, layers, tool capacity, metric selection, and metrology tool type. By using specific locator coordinates, first-to-fail, process window corners, and health-of-the-line metrics are selected within the sample plan. High resolutions are gained because defect scanning inspections are not needed. Extent of the process sensitive sites or other layout attributes are also considered. In the preferred embodiment, process sensitive sites are ported to the metrology and inspection equipment, block 54. Process recipes from historic sensitive site evidence are also selected and downloaded.

In the preferred embodiment, database connectivity provides for statistical limits charting from in-line systematic limited yield results (inspection and metrology results) as described in block 55. The embodiment includes an automatic tool shutdown based on a shift seen in systematic limited yield metrics. From these results, characterization analysis of yield impacts, manufacturing engineering analysis for tool and process trends, feed forward to the design and development community, as well as feedback to customers is achieved.

An additional benefit that stems from the use of process sensitive sites and downloaded coordinates is the shortened time it takes to detect a shift in the fabricator. Historically, limited yield analysis, process learning, and technology qualification generally entail electrical review of kerf monitors, random defect scans and classification, along with wafer final test; product disposition limits are put on defectivity and electrical parameters for quality containment; fail samples are chosen for physical analysis. The mean-time-to-detect in this historical methodology can be extensive and can miss the systematic failure cause and effect. The process sensitive sites locator provides coordinates for hard to find sites, especially useful when the layout includes a small number of sensitive site occurrences within the chip data. The result is earlier detection, analysis, and disposition of systematic yield limiters within the release cycle of new partnumbers, block 56. Existing focus teams, in daily and weekly forums, review tool trends and yield parameters, and systematic losses, blocks 57 and 58.

In the case of the process sensitive site described earlier, minimum pitch metal over insulator trenches, the fail mechanism was not well understood and the layout sensitivity had not been previously exercised on incoming designs, block 51*a*. Upon detecting the systematic fail site, a dimensional assessment and tolerance latitude were determined by engineering; manufacturing was engaged in the controls methodologies selected, blocks 52 and 53. 3D design checking was initiated with the process sensitive site location coordinates downloaded to control tools, block 54. Control limits were established for the in-line inspection metric, block 55. Rework plans were established as part of disposition and tactical actions, block 56. Results of the controls methodologies, as tool and yield trends were monitored and reviewed for manufacturing stability, block 57. Improvements to the process integration were evaluated and qualified, block 58.

From lessons learned on process sensitive site locations, other partnumbers and customer design style comparisons are initiated. Tactical and strategic solutions are determined from these physical design characterization results. The solutions may include, but are not limited to, generation of automated design tools to modify the sensitive structure into a process compatible layout, generation of measurement sites to develop new controls methodologies, development of processes or process adjustments to offer larger process window, redesign of existing partnumbers based on degree of problem and serviceability, and lastly, changes to groundrules and checking deck to eliminate the use of the sensitive structure, as shown in block 59.

The invention claimed is:

1. A physical design characterization system which comprises:
    a release environment which comprise physical design data files;
    a queuing system that controls what physical design data files are released to a 3D design checker;
    a design check library which contains physical design structures comprising a construct of design shapes of process sensitive regions from previously released devices;
    the 3D design checker connected to the design check library and a runtime environment; and
    the runtime environment which operates on the physical design data files using the 3D design checker and produces target matches.

2. The physical design characterization system of claim 1 wherein the target matches are comprised of vectors or shapes inserted into the physical design data files.

3. The physical design characterization system of claim 2 which also comprises a graphics processing system which operates on the target matches.

4. The physical design characterization system of claim 2 which also comprises a web interface connected to graphic processing which communicates output of the graphics processing system.

5. The physical design characterization system of claim 3 wherein the graphics processing system collects and sorts the target matches by type.

6. The physical design characterization system of claim 3 wherein the graphics processing system converts the target matches into views.

7. The physical design characterization system of claim 3 wherein the graphics processing system convert the target matches into a format recognizable by analysis and processing equipment.

8. The physical design characterization system of claim 1 wherein a website interface provides for series of graphical pages for each target match of a particular type of target.

* * * * *

UNITED STATES PATENT AND TRADEMARK OFFICE
CERTIFICATE OF CORRECTION

PATENT NO. : 7,584,077 B2  Page 1 of 1
APPLICATION NO. : 10/710113
DATED : September 1, 2009
INVENTOR(S) : Bergman Reuter et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1058 days.

Signed and Sealed this

Fourteenth Day of September, 2010

David J. Kappos
*Director of the United States Patent and Trademark Office*